(12) United States Patent
Chomont et al.

(10) Patent No.: US 9,273,241 B2
(45) Date of Patent: Mar. 1, 2016

(54) HIGH-RESOLUTION IMAGING SYSTEM

(75) Inventors: Christian Chomont, Paris (FR); Francoise Cau, Paris (FR); Michel Pealat, Paris (FR); Vincent Duriaud, Paris (FR)

(73) Assignee: SAGEM DEFENSE SÉcuritÉ, Paris (FR)

( * ) Notice: Subject to any disclaimer, the term of this patent is extended or adjusted under 35 U.S.C. 154(b) by 67 days.

(21) Appl. No.: 14/002,939

(22) PCT Filed: Feb. 17, 2012

(86) PCT No.: PCT/FR2012/050349
§ 371 (c)(1),
(2), (4) Date: Sep. 3, 2013

(87) PCT Pub. No.: WO2012/120214
PCT Pub. Date: Sep. 13, 2012

(65) Prior Publication Data
US 2013/0342755 A1 Dec. 26, 2013

(30) Foreign Application Priority Data
Mar. 4, 2011 (FR) ...................................... 11 51790

(51) Int. Cl.
*C09K 5/20* (2006.01)
*A23L 3/37* (2006.01)
(Continued)

(52) U.S. Cl.
CPC ... *C09K 5/20* (2013.01); *A23L 3/37* (2013.01); *E01C 21/00* (2013.01); *G02B 3/0031* (2013.01); *G02B 13/0095* (2013.01); *G02B 13/14* (2013.01); *G02B 26/0875* (2013.01); *H01L 27/14625* (2013.01); *H04N 5/2254* (2013.01); *H04N 5/349* (2013.01); *H01L 27/14621* (2013.01)

(58) Field of Classification Search
CPC ............. H04N 5/2254; H04N 5/23232; H01L 27/14621
See application file for complete search history.

(56) References Cited

U.S. PATENT DOCUMENTS

| 5,796,522 A | * | 8/1998 | Meyers | ................ G02B 3/0056 359/626 |
| 6,980,248 B1 | * | 12/2005 | Suda | .................... H04N 5/2254 348/335 |

(Continued)

FOREIGN PATENT DOCUMENTS

| GB | 1 057 624 A | 2/1967 |
| GB | 2 248 310 A | 4/1992 |

OTHER PUBLICATIONS

International Search REport or PCT/FR2012/050349, dated Sep. 10, 2012.

*Primary Examiner* — Ahmed A Berhan
(74) *Attorney, Agent, or Firm* — Marshall, Gerstein & Borun LLP

(57) ABSTRACT

The invention relates to a high-resolution imaging system for recording images of the same scene, that are sampled in a complementary manner. To this end, an image filter (2) is arranged in an intermediate focusing plane (PI), and a matrix (3) of microlenses is arranged at a distance from the image filter, with each microlens that is associated with an opening (O2) of the image filter. An image detection matrix (9) is then optically conjugated with the microlens matrix. The system also comprises a device for moving an intermediate image in relation to the image filter (2). Such an imaging system is especially suitable for recording high-resolution infrared images.

12 Claims, 5 Drawing Sheets

(51) Int. Cl.
*E01C 21/00* (2006.01)
*H04N 5/225* (2006.01)
*H01L 27/146* (2006.01)
*G02B 26/08* (2006.01)
*G02B 3/00* (2006.01)
*G02B 13/14* (2006.01)
*G02B 13/00* (2006.01)
*H04N 5/349* (2011.01)

(56) References Cited

U.S. PATENT DOCUMENTS

| | | | | |
|---|---|---|---|---|
| 8,497,934 | B2* | 7/2013 | Milnes | G02B 27/22 348/363 |
| 2009/0122148 | A1 | 5/2009 | Fife et al. | |
| 2011/0128412 | A1* | 6/2011 | Milnes et al. | 348/231.99 |

* cited by examiner

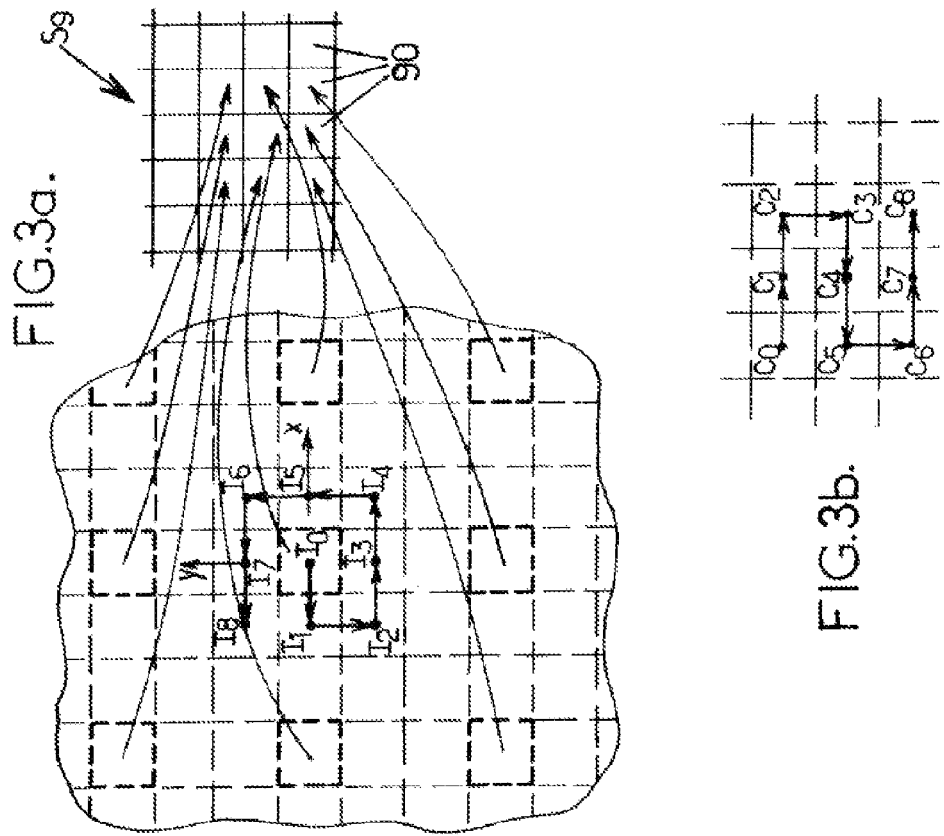
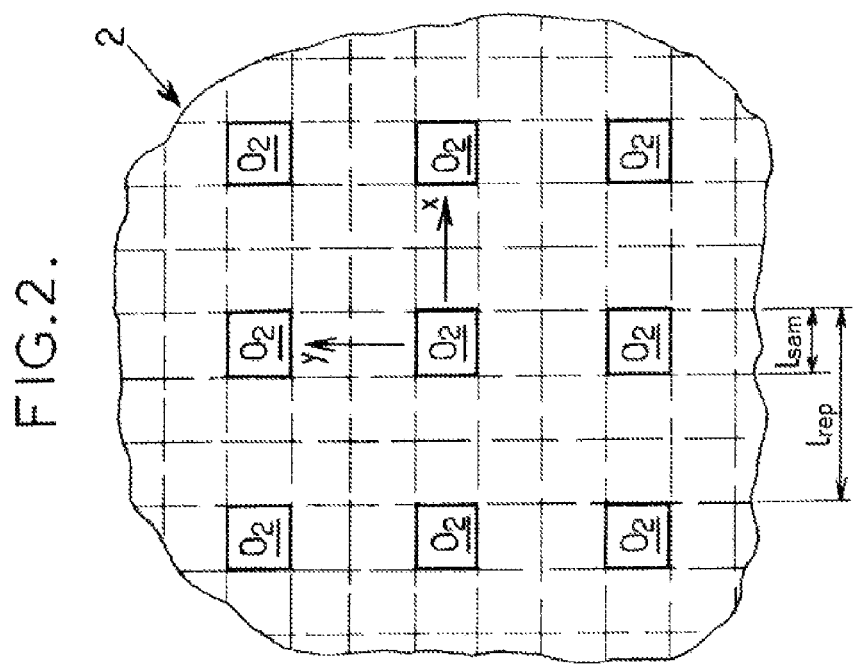

HIGH-RESOLUTION IMAGING SYSTEM

FIELD OF THE INVENTION

The present invention relates to a high-resolution imaging system.

BACKGROUND OF THE INVENTION

Numerous observation applications require high-resolution images to be obtained, in order to identify details with small dimensions in a scene which is observed. Now, the resolution of an image which is captured with an imaging system depends on the magnification of the image forming optical system which is used, and the dimension of the photosensitive elements of the image sensor.

Using an image forming optical system which has a significant magnification has the drawback, generally, of reducing the entrance field of the system. In other words, the images which are formed and captured are each limited to a restricted portion of the scene observed. Conversely, the image of each detail of the scene is very small when an optical system with a large entrance field is used. Moreover, when the image of the detail becomes smaller than a photosensitive element of the image sensor which is used, this detail is no longer visible in the image captured.

This difficulty in obtaining high-resolution images with an entrance optical field which is not too small is even more significant for an observation in the infrared range, relative to an observation in the visible range. Indeed, the individual dimension of the photosensitive elements of an infrared image sensor is currently of the order of 12 to 15 μm (micrometer), while sensors are available for the visible light range with photosensitive elements which have individual dimensions of the order of 2 to 3 μm. For example, the capture of an image with an angular aperture of the entrance optical field of 90° (degree) and an angular resolution of 200 μrad (microradian) is directly possible with visible light with a sensor of 8000×8000 photosensitive elements. But these imaging features are not directly achievable for infrared radiation in the wavelength band of 8 to 12 μm.

SUMMARY OF THE INVENTION

Therefore the following solutions are used to overcome this difficulty:
- the implementation of a scan of the entrance optical field of the imaging system in the scene which is observed. But a mechanical scanning device is then necessary, which is generally complex and fragile;
- the implementation of a zoom system in order to obtain high resolution in a portion of interest of the scene observed. But the zoom system requires using an optical system which more complex and more expensive with moving parts. Moreover, using of a zoom system has the drawback of considerably reducing the size of the scene which is observed; and
- the simultaneous use of several sensors, which are arranged to respectively capture different portions of the image with a high resolution. The total image of the scene is then reconstituted by juxtaposing all the parts of the image which are captured by the separate sensors. But such a system with several sensors is particularly expensive, due to the number of sensors and the necessity to arrange them in different image planes in order to avoid blind bands between the adjacent image portions which are captured by different sensors.

Under these conditions, a general object of the present invention consists in providing an imaging system which produces images with a high resolution and an entrance optical field which is not too restricted.

More particularly, a first object of the invention consists in providing an imaging system which produces high-resolution images, without this system incorporating moving parts which are fragile or complex to produce.

A second object of the invention consists in providing an imaging system which produces high-resolution images making it possible to cover an entrance optical field which is broad, for example with an angular aperture of the order of 90°.

A third object of the invention consists in providing such an imaging system with a price which is not substantially increased, in particular an imaging system with an optical system, which is simple and which uses only one image sensor.

Finally, a general object of the invention is to achieve the previous ones for an imaging system which is effective in the infrared range.

In order to meet these objects and others, the invention proposes a high-resolution imaging system which comprises, along a propagation direction of a useful radiation inside the imaging system:
- a lens, which is suitable for forming an intermediate image of a scene inside an intermediate focusing plane;
- an image filter, comprising an opaque, plane mask provided with openings which are situated in the intermediate focusing plane;
- a planar matrix of microlenses which are identical and juxtaposed in at least two alignment directions, this matrix of microlenses being arranged parallel to and at a distance from the intermediate focusing plane;
- an optical conjugation system, which is arranged in order to form an image of the matrix of microlenses in an image capture plane; and
- an image detection matrix, which comprises a set of photosensitive elements arranged in the image capture plane.

The lens, the image filter mask, the microlenses, the photosensitive elements and the optical conjugation system are effective for the useful radiation.

According to a first additional characteristic of the invention, each microlens and each photosensitive element are conjugated one-to-one by the optical conjugation system.

According to a second additional characteristic of the invention, the openings of the image filter mask are moreover arranged facing the microlenses with a one-to-one relationship between each opening and each microlens.

According to a third additional characteristic of the invention, one dimension of each opening of the image filter mask, when it is measured parallel to each alignment direction, is less than or equal to a sampling pitch of the intermediate image, this sampling pitch being itself equal to a repetition pitch of the openings of the image filter mask according to the same alignment direction, but divided by a sampling factor which is an integer and greater than unity.

According to a fourth additional characteristic of the invention, the imaging system also comprises an image moving device which is suitable for translating the intermediate image within the intermediate focusing plane, according to a translation pitch which is equal to or a multiple of the sampling pitch of the intermediate image parallel to each alignment direction.

Thus, in an imaging system according to the invention, the image capture plane in which the photosensitive elements used for image detection and capture are situated, is not optically conjugated with the intermediate image of the scene observed which is formed by the lens. Instead of this, the image capture plane is optically conjugated with the matrix of microlenses, this being spaced apart from the intermediate focusing plane by a determined and non-zero separation distance. This optical conjugation relationship between the matrix of microlenses and the image capture plane is produced by the optical conjugation system. During use of the imaging system, each opening of the image filter then constitutes a pupil for the microlens which is associated with this opening.

The image which is captured at each exposure then corresponds to a sampling of the scene which is contained in the entrance optical field of the lens, with the image filter which selects a sampling matrix in the intermediate image. This selection is carried out by the image moving, by each time placing the intermediate image in a position selected with respect to the image filter. The sampling of the scene is then varied during successive image captures, in order to obtain additional samplings of the scene. In other words, the movement of the intermediate image with respect to the image filter produces a scan of the scene. The final image can then be reconstructed by combining the images which have been captured in this way for all the positions of the intermediate image with respect to the image filter.

The resolution of the final image is thus multiplied by the sampling factor, with respect to an imaging system known before the invention, with constant values for the magnification of the lens and of the dimension of the photosensitive elements of the image detection matrix.

In various embodiments of the invention, the distance between the matrix of microlenses and the intermediate focusing plane is preferably greater than 200 µm.

A system according to the invention may also comprise a control unit which is suitable for:
  controlling the image moving device so as to place the intermediate image successively in positions shifted by multiples of the sampling pitch, parallel to each alignment direction; and
  for each position of the intermediate image, issuing a command for an image capture and recording sequence to be performed by the image detection matrix.

It may also comprise an image reconstruction unit, suitable for combining the images which are captured and recorded respectively for the successive positions of the intermediate image, by means of interlacing according to these successive positions.

An imaging system according to the invention may be suitable, in particular, for operating with a useful radiation which is situated in the infrared range.

BRIEF DESCRIPTION OF THE DRAWINGS

Other features and advantages of the present invention will become apparent from the following description of non-limitative embodiment examples, with reference to the attached drawings, in which:

FIG. 2 is a plan view of a portion of an image filter which can be used in the imaging system of FIG. 1;

FIGS. 3a and 3b show two scanning modes of which can be implemented alternatively with the image filter of FIG. 2;

Figure 1:
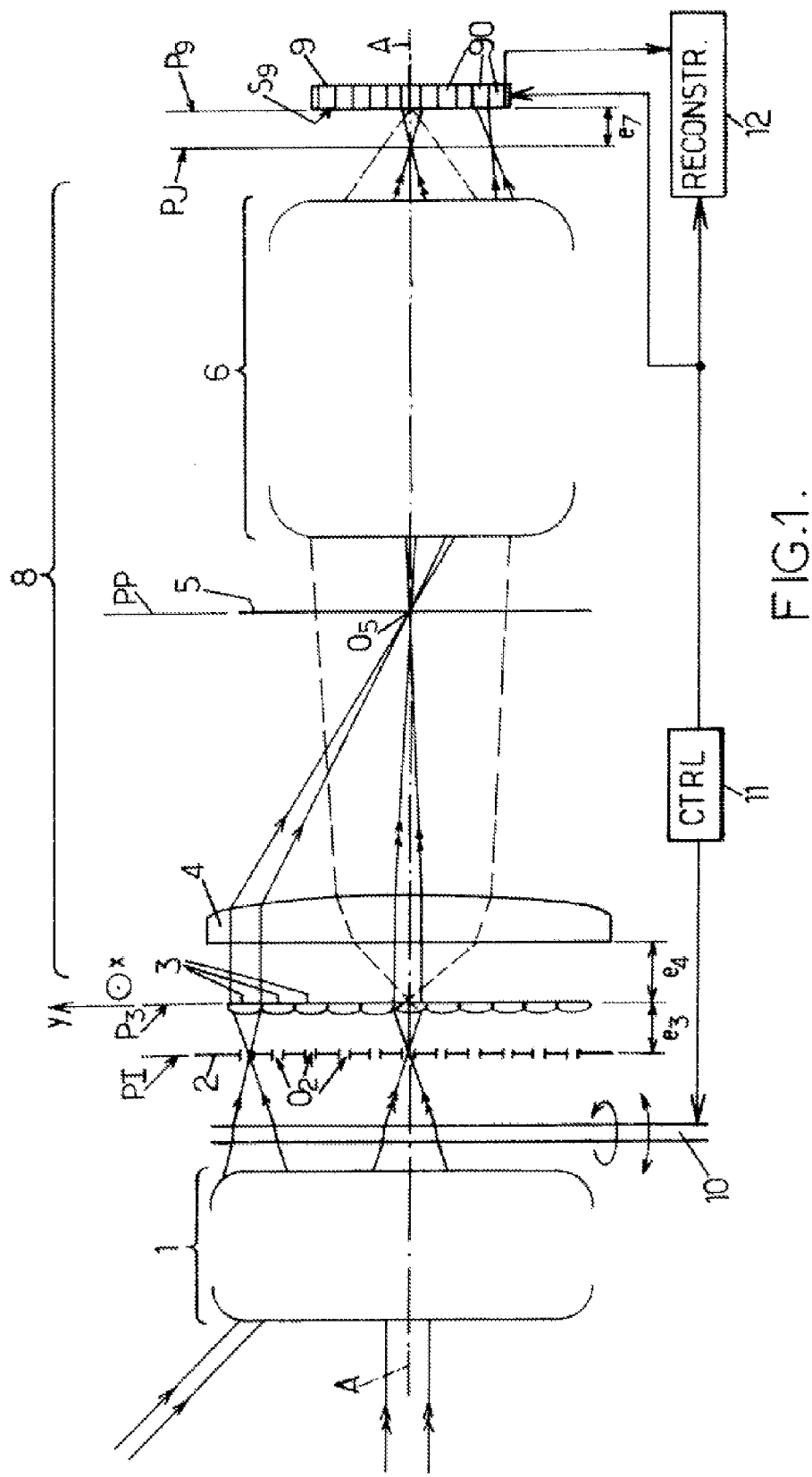
FIG. 1 is a basic optical diagram of an imaging system according to the present invention.

For clarity sake, the dimensions of the elements which are represented in these figures do not necessarily correspond to actual dimensions or to actual aspect ratios. Moreover, identical references which are indicated in different figures denote elements which are identical or which have identical functions.

DETAILED DESCRIPTION

The general operating principle of an imaging system according to the invention is now described in first instance, with reference to FIGS. 1, 2, 3a and 3b.

The references which are now indicated denote the following elements of the imaging system:
A-A: optical axis of the imaging system,
1: lens arranged along the optical axis A-A,
2: image filter,
3: microlenses arranged in the form of a plane matrix,
8: optical conjugation system,
9: image detection matrix, commonly called image sensor,
90: photosensitive elements of the image sensor 9.

The lens 1 is shown globally, on the understanding that it can be constituted in any way whatever assumed to be known to a person skilled in the art. The model of lens 1 can be selected according to the spectral range of operation of the system imaging, its magnification and the angular aperture of the entrance optical field, in a suitable manner for each application of the system. In particular, the angle of the entrance optical field of the lens 1 may be greater than 60°, for example equal to approximately 90°. The optical axis of the lens 1 is superimposed over the axis A-A of the system.

The lens 1 produces forms an intermediate image of a scene which is situated inside its entrance optical field, in an intermediate focusing plane denoted PI. The plane PI is thus perpendicular to the optical axis A-A.

The image filter 2 may be a planar mask which is opaque outside openings $O_2$ by which the radiation passes through the mask. This mask is constituted by a very thin sheet, ideally with a non-significant thickness. According to FIG. 2, the openings $O_2$ are regularly distributed, with a repetition pitch which is marked $I_{rep}$. The openings $O_2$ may be distributed along two perpendicular directions, with the repetition pitch $I_{rep}$ in each one of these directions. They then form a square array. Moreover, each opening $O_2$ has dimensions which are less than or equal to a base length $I_{sam}$ which is a divisor of the repetition pitch $I_{rep}$ of the openings. For a reason which will be explained below, the base length $I_{sam}$ is called the sampling pitch. For the purposes of illustration, the sampling pitch $I_{sam}$ which is shown in FIG. 2 is equal to a divisor of the repetition pitch $I_{rep}$ of the openings $O_2$. The ratio between the pitchs $I_{rep}$ and $I_{sam}$ of the image filter is called the sampling factor and denoted SF. It is an integer greater than unity. In the example shown, it is equal to 3.

The image filter 2 is situated in the intermediate focusing plane PI.

The matrix of microlenses 3 extends in a plane $P_3$ which is parallel to the intermediate focusing plane PI. The plane $P_3$ is therefore also perpendicular to the optical axis A-A. Preferably, the microlenses 3 are adjacent to each other, so as to partition the plane $P_3$ without dead zones between two neighbouring microlenses. All the microlenses 3 are identical to each other, with a common focal length $f_3$. x and y denote two alignment directions of the microlenses 3 in the plane $P_3$.

The image sensor 9 is arranged so that that a detection surface thereof, which is denoted $S_9$, is situated in an image capture plane $P_9$ which is perpendicular to the optical axis A-A. Within the detection surface $S_9$, the photosensitive elements 90 are regularly arranged, according to an array which depends on the type of sensor used.

The configuration of the imaging system then has the following first two characteristics:

/1/ the optical conjugation system 8 forms an image of the matrix of microlenses 3 in the image capture plane $P_9$, such that the respective images of microlenses 3 which are adjacent are formed on photosensitive elements 90 which are themselves adjacent in the detection surface $S_9$, without the image of each microlens 3 overlapping several adjacent photosensitive elements 90; and /2/ the distribution of the openings $O_2$ of the image filter 2, in the intermediate focusing plane PI, reproduces the distribution of the microlenses 3 in the plane $P_3$, so that the microlenses 3 are associated one-to-one with the openings $O_2$.

Thus, the distribution of the photosensitive elements 90 in the detection surface $S_9$ determines the distributions of the microlenses 3 and the openings $O_2$. The directions x and y are therefore the common alignment directions of the openings $O_2$, of the microlenses 3 and of the photosensitive elements 90, in the planes PI, $P_3$ and $P_9$ respectively. The repetition pitch $I_{rep}$ is common to the openings $O_2$ and to the microlenses 3, and is equal to the pitch of the photosensitive elements 90 in the detection surface $S_9$ of the image sensor 9, but divided by the magnification of the optical conjugation system 8. According to the distribution pattern of the openings $O_2$ which has been described above, that of the photosensitive elements 90 and that of the microlenses 3 are also square in the detection surface $S_9$ and in the plane $P_3$, respectively.

In a preferred embodiment of the invention, each opening $O_2$ of the image filter mask 2 may be centred with respect to the microlens 3 which is situated facing this opening.

In FIG. 1, the rays which are drawn in broken lines show the optical conjugation relationship between the microlenses 3 and the photosensitive elements 90, through the optical system 8.

According to a third characteristic /3/ of the configuration of the imaging system, the plane $P_3$ of the microlenses 3 is situated at a non-zero distance from the intermediate focusing plane PI, downstream of the latter along the direction of propagation of the rays inside the imaging system. The non-zero distance between the planes PI and $P_3$ is denoted $e_3$. As a result of this defocusing of the optical conjugation system 8 with respect to the intermediate focusing plane PI, this plane PI is optically conjugated by the optical system 8 with a plane PJ in which the image of the observed scene is located, and which is distant from the image capture plane $P_9$. $e_7$ denotes the non-zero distance of separation between the planes PJ and $P_9$. In FIG. 1, the rays drawn in continuous lines show the optical conjugation relationship between the intermediate focusing plane PI and the plane PJ: the rays which originate from a single intermediate image point contained in the plane PI cross inside the plane PJ, at the distance $e_7$ from the surface $S_9$ of the image sensor 9. In other words, the plane PJ is actually the image formation plane, which is at a distance from the image capture plane $P_9$.

According to a possibility that is preferred for the implementation of the invention, the distance $e_3$ between the intermediate focusing plane PI and the matrix of microlenses 3, is equal to the common focal length $f_3$ of the microlenses 3. The beam of rays which originate from the scene observed is then collimated by the microlenses 3. In this case, the distance $e_4$ between the plane $P_3$ of the microlenses 3 and the optical conjugation system 8 can be any distance.

According to a possible embodiment of the optical conjugation system 8, this latter may itself comprise at least the following elements, along the direction of propagation of the useful radiation inside the imaging system:

an optical refocusing system 4, which is centred with respect to the optical axis A-A and which may be constituted by a positive lens having large cross-dimensions;

a diaphragm 5, which is situated in a plane PP conjugated with the image filter mask 2 through the microlenses 3 and the optical refocusing system 4; and an optical relay system 6, which is arranged to form the image of the matrix of microlenses 3 in the image capture plane $P_9$, through the optical refocusing system 4 and this optical relay system 6.

The diaphragm 5 has an opening $O_5$ which is centred on the optical axis A-A in the embodiment described here. The opening $O_5$ may have the same dimensions as the common image of all the openings $O_2$ of the image filter mask 2 through the matrix of microlenses 3 and the optical refocusing system 4. Optionally, it may be smaller than this image of the openings $O_2$. In the latter case, this is then the opening $O_5$ which defines the entrance pupil of the whole imaging system, and the plane PP is called the pupil plane.

Each image which is captured in this way during an exposure and reading sequence of the image sensor 9 thus corresponds to a sampling of the intermediate image of the plane PI. This sampling is defined by the image filter 2, with $I_{rep}$ which is the spatial periodicity of the sampling of the intermediate image for each exposure and reading sequence of the sensor 9. Simultaneously, the individual dimensions and the shape of the openings $O_2$ determine the convolution function of each sampling point.

FIG. 3a shows, by means of curved arrows, the assignment of the openings $O_2$ of the image filter 2, and therefore of the portions of the intermediate image corresponding to the photosensitive elements 90 of the image sensor 9. This assignment results from the optical conjugation relationships which have been described above.

The imaging system also comprises a device for displacing the intermediate image within the intermediate focusing plane PI. This device may be produced in several ways, which are known to a person skilled in the art. For example, a plate 10, which is transparent to the useful radiation, may be arranged between the lens 1 and the intermediate focusing plane PI. This plate 10 has an inclination which is variable with respect to the optical axis of the lens 1. In other words, the plate 10 can be rotated independently and simultaneously about two axes perpendicular to each other, which are respectively parallel to the two alignment directions x and y. In a known manner, a rotation of the plate 10 about an axis parallel to x causes a movement of the intermediate image parallel to y, and vice-versa. By using suitable increments for these rotations of the plate 10, the intermediate image can thus be translated by an integer number of times the sampling pitch $I_{sam}$ along the two directions x and y inside the plane PI. In particular, the plate 10 may have parallel faces.

According to an alternative embodiment of the device for moving the intermediate image, the latter may comprise a series of plates, transparent to the useful radiation and interchangeable, each plate being arranged alternatively between the lens 1 and the intermediate focusing plane PI, and producing a different shift of the intermediate image inside this intermediate focusing plane. For example, each of the plates may also have parallel faces, with tilt angles which are fixed with respect to the two alignment directions x and y. Two different plates then have respective thicknesses and tilt angles which are suitable for translating the intermediate image differently in the plane PI, according to multiples of the sampling pitch $I_{sam}$ parallel to the two directions x and y. For example, such interchangeable plates can be mounted on a cylinder, which is arranged to interpose a single one of these plates at one time on the path of the radiation between the lens 1 and the image filter 2.

Starting from a first position of the intermediate image in the plane PI, for which a first image capturing and recording sequence is executed by the sensor 9, the device for moving the intermediate image is activated in order to bring the intermediate image into a new position remote from the first one by $n_x \times I_{sam}$ along the x direction and $n_y \times I_{sam}$ along the y direction inside the plane PI. To this end, $n_x$ and $n_y$ are two integers, positive, negative or zero. A new image is then captured and recorded by the sensor 9. This image movement, capture and recording sequence is also repeated until all possible positions of the intermediate image with respect to the image filter 2 have been realized. In the identification of these possible positions of the intermediate image with respect to the image filter 2, two different positions are separated by $n_x \times I_{sam}$ along the x direction and $n_y \times I_{sam}$ along the y direction, $n_x$ and $n_y$ not being zero simultaneously, and being limited so that a single image point which is in one of the openings $O_2$ for one of the positions of the intermediate image is not inside another opening in another position of the intermediate image. FIGS. 3a and 3b show two possible series of positions of the intermediate image, $I_0$ to $I_8$ and $C_0$ to $C_8$ when the sampling factor SF is equal to 3. Based on these examples, a person skilled in the art will be able to reproduce the invention for any value of the sampling factor SF. For example, when the sampling factor SF is equal to 4 or 5, 16 and 25 positions for the intermediate image with respect to the image filter 2 are necessary, respectively.

Figure 4:
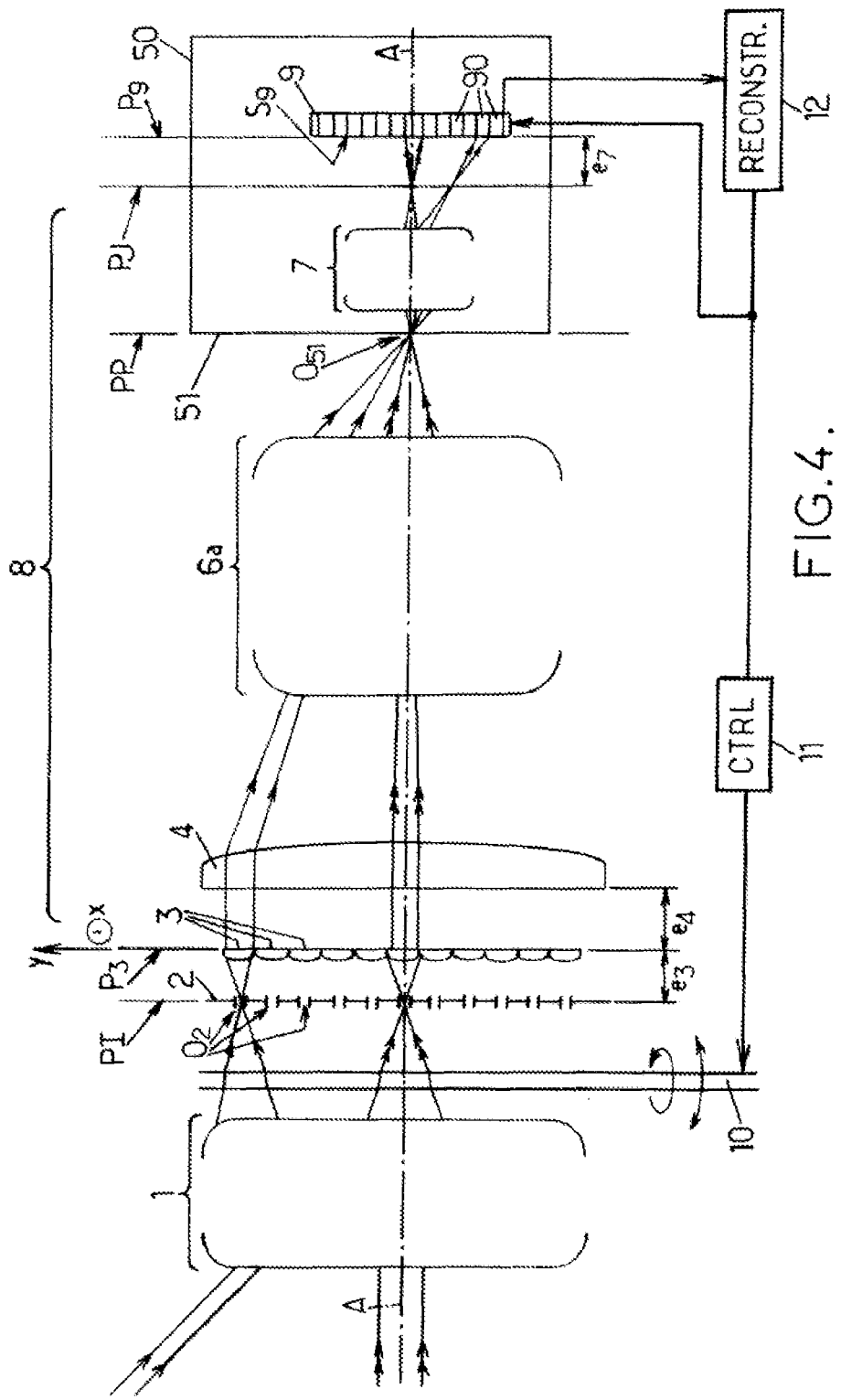
FIG. 4 is a basic optical diagram of another imaging system according to the present invention, which is suitable for operating in the infrared range.

A control unit 11, which is denoted CTRL in FIGS. 1 and 4, coordinates the operations of the device for moving the intermediate image and of the image sensor 9 in the manner which has just been described.

Finally, a image reconstruction unit 12 combines the images which have been captured for all the positions of the intermediate image in the plane PI, so as to produce a final image having a resolution which is $I_{sam}$ in the intermediate focusing plane PI. The matrix of this final image corresponds to the sampling pitch $I_{sam}$. For each position the intermediate image in the plane PI, the unit 12 then assigns the intensity values which have been captured by the sensor 9 to the pixels of this image matrix, with an assignment relationship which is the reverse of the curved arrows of FIG. 3a. Then this assignment step is repeated by reproducing in the final image matrix the successive movements of the intermediate image in the plane PI. The final image is thus completed by interlacing the images which have been captured individually for each position of the intermediate image.

If the optical conjugation system 8 has not been adjusted so as to conjugate the plane $P_3$ of the microlenses 3 with the image capture plane $P_9$, a diaphony occurs between the pixels of the reconstructed image, and the final image obtained is blurred or hazy. Such is the case, in particular, when the plane PI of the image filter 2 is optically conjugated with the plane $P_9$.

According to another possible embodiment of the optical conjugation system 8 which is illustrated by FIG. 4, the optical system 8 may alternatively comprise at least the following elements, following the propagation direction of the useful radiation inside the imaging system:

again the optical refocusing system 4;

an optical relay system 6a, which is now arranged in order to form an image of the openings $O_2$ of the image filter mask 2 through the microlenses 3, the optical refocusing system 4 and this optical relay system 6a; and a end portion of the optical system 7, which is arranged in order to form the image of the matrix of microlenses 3 in the image capture plane $P_9$ through the optical refocusing system 4, the optical relay system 6a and this end portion of the optical system 7.

The other elements of the imaging system may be identical in their principle of realization and implementation to their description already given with reference to FIGS. 1, 2, 3a and 3b.

As for lens 1, the possible compositions of the optical relay system 6a and the end portion of the optical system 7 are available to a person skilled in the art.

Such an embodiment is particularly suitable for capturing infrared images. In other words, the useful radiation which is detected by the image sensor 9 may have a wavelength situated in one of the bands from 3 to 5 μm (micrometer) and from 8 to 12 μm. The common image of the openings $O_2$ of the image filter mask 2 which is formed through the microlenses 3, the optical refocusing system 4 and the optical relay system 6a constitute a pupil of the imaging system. This pupil is situated in a plane PP between the optical relay system 6a and the end portion of the optical system 7. A diaphragm 51 may then be placed in the plane PP, in order to isolate the image sensor 9 with respect to stray radiation, in particular of thermal origin, which is present in the imaging system between the lens 1 and this diaphragm. The diaphragm 51 has an opening $O_{51}$ which corresponds to the pupil of the plane PP, this being commonly called "cold pupil" in the jargon of a person skilled in the art. In particular, the end portion of the optical system 7 and the image sensor 9 may be contained in a cryostat 50, a front wall of which is provided with a entrance window which is superimposed on the image of the openings $O_2$ in the plane of the pupil PP, and constitutes the diaphragm 51.

Figure 5A:
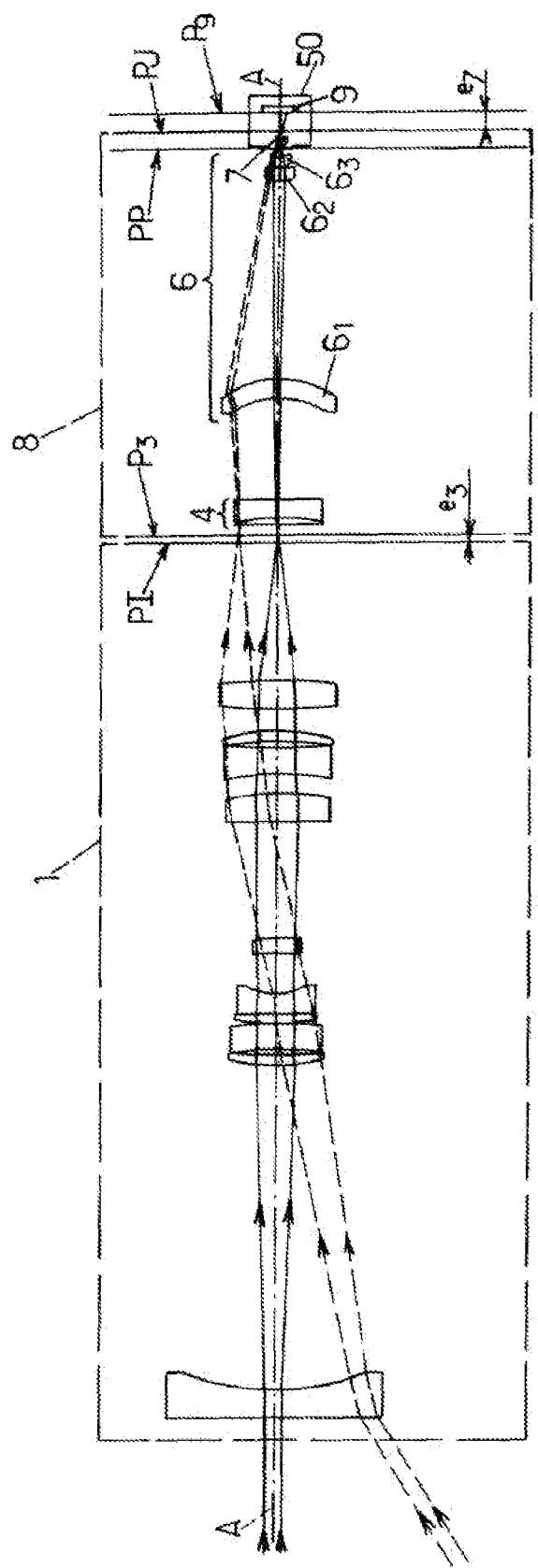
FIGS. 5a and 5b show a practical embodiment of an imaging system according to FIG. 4.
Figure 5B:
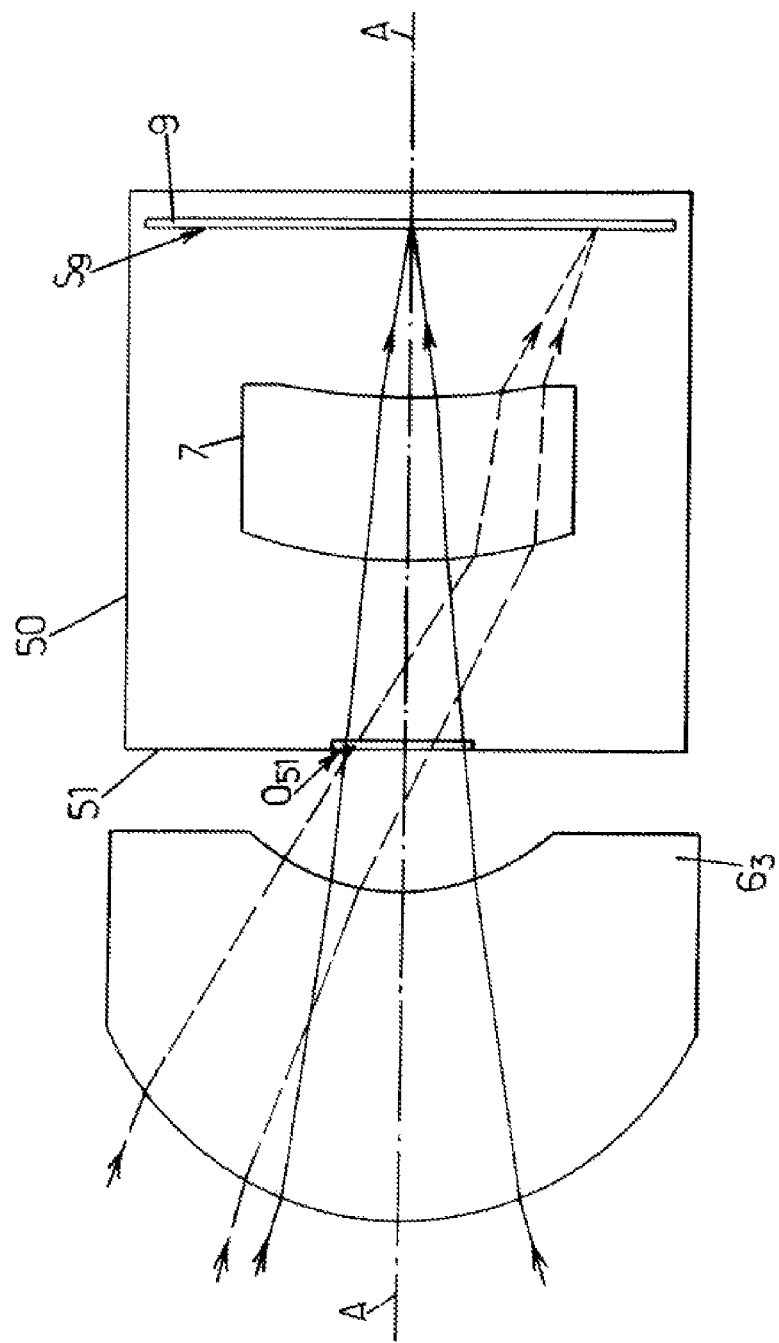

FIGS. 5a and 5b represent a possible embodiment of the lens 1 and the optical conjugation system 8 for such an infrared imaging device. For the sake of clarity of FIG. 5a, the device 10 for moving the intermediate image, the image filter 2 and the microlenses 3 have not been shown, and FIG. 5b is an enlarged view of the end portion of the system. Only the positions of the intermediate focusing plane PI, the plane $P_3$ of the microlenses 3, the plane of the cold pupil PP, the image formation plane PJ and the image capture plane $P_9$ are indicated. A person skilled in the art will automatically understand the meaning of each optical element which is represented. In particular, the elements $6_1$ to $6_3$ together constitute the optical relay system 6a. The following values are also given by way of illustration for such an infrared imaging system according to the invention:

the matrix of photosensitive elements 90 of the image sensor 9 may have an pitch of 25 μm, and contain 400× 400 photosensitive elements, with each photosensitive element 90 based on an InGaAs semiconductor;

the transparent plate 10 may be made of beryllium, with an amount of tilt angle which is less than a few degrees;

the dimension of the openings $O_2$ of the image filter mask 2 may be equal to the sampling pitch $I_{sam}$, of 15 μm;

each microlens 3 may individually have a diameter of 100 μm;

the distance $e_3$ between the planes PI and $P_3$ may be of the order of 400 μm;

the optical aperture of the system may be F/4; and the diameter of the opening of the cold pupil $O_{51}$ may be of the order of 400 to 500 μm.

It is understood that the invention can be reproduced by introducing numerous adaptations with respect to the embodiments which have just been described in detail, while retaining at least some of the advantages which have been mentioned. These adaptations may depend on the application of the imaging system. They may relate in particular to the production of the lens 1, that of the system for moving of the intermediate image as well as to the composition of the optical conjugation system 8. Moreover, the array pattern which is common to the openings of the image filter mask, to the microlenses and to the photosensitive elements in their respective planes may not be square, but rectangular, triangular, hexagonal, etc.

The invention claimed is:

1. High-resolution imaging system comprising, along a propagation direction of a useful radiation inside the imaging system:
    a lens which is suitable for forming an intermediate image of a scene inside an intermediate focusing plane;
    an image filter, comprising an opaque, planar mask, provided with openings which are situated in the intermediate focusing plane;
    a planar matrix of microlenses which are identical and juxtaposed in at least two alignment directions, said matrix of microlenses being arranged parallel to and at a distance from the intermediate focusing plane;
    an optical conjugation system, which is arranged in order to form an image of the matrix of microlenses in an image capture plane; and
    an image detection matrix, comprising a set of photosensitive elements arranged in the image capture plane;
    the lens, the image filter mask, the microlenses, the photosensitive elements and the optical conjugation system being effective for the useful radiation,
    each microlens and each photosensitive element being conjugated one by one by the optical conjugation system,
    the openings of the image filter mask being moreover arranged facing the microlenses with a one-to-one relationship between each opening and each microlens,
    one dimension of each opening of the image filter mask, measured parallel to each alignment direction, being less than or equal to a sampling pitch of the intermediate image, said sampling pitch being itself equal to a repetition pitch of said openings in said alignment direction, but divided by a sub-sampling factor which is a positive integer of 5 or less and greater than unity,
    the imaging system also comprising:
    an image moving device which is suitable for translating the intermediate image within the intermediate focusing plane, using a translation pitch which is equal to or a multiple of the sampling pitch of said intermediate image parallel to each alignment direction.

2. The high-resolution system according to claim 1, in which the distance between the matrix of microlenses and the intermediate focusing plane is equal to a common focal length of said microlenses.

3. The high-resolution system according to claim 1, in which the distance between the matrix of microlenses and the intermediate focusing plane is greater than 200 μm and equal to or less than 400 μm.

4. The high-resolution system according to claim 1, in which each opening of the image filter mask is centred with respect to the microlens which is situated facing said opening.

5. The high-resolution system according to claim 1, in which the optical conjugation system comprises, along the propagation direction of the useful radiation inside said imaging system, at least:
    an optical refocusing system;
    a diaphragm situated in a plane conjugated with the image filter mask through the microlenses and the optical refocusing system; and
    an optical relay system arranged in order to form the image of the matrix of microlenses in the image capture plane through the optical refocusing system and said optical relay system.

6. The high-resolution system according to claim 1, in which the optical conjugation system comprises, along the propagation direction of the useful radiation inside said imaging system, at least:
    an optical refocusing system;
    an optical relay system arranged for forming an image of the openings of the image filter mask through the microlenses, the optical refocusing system and said optical relay system; and
    a optical system end portion arranged for forming the image of the matrix of microlenses in the image capture plane through the optical refocusing system, the optical relay system and said optical system end portion.

7. The high-resolution system according to claim 1, suitable for a useful radiation situated in the infrared range, the useful radiation detected by the image sensor having a wavelength situated in either a first band from 3 μm to 5 μm or a second band from 8 μm to 12 μm.

8. The high-resolution system according to claim 1, in which the image moving device comprises a plate which is transparent to the useful radiation, and arranged between the lens and the intermediate focusing plane, said plate having a variable inclination with respect to an optical axis of the lens.

9. The high-resolution system according to claim 1, in which the image moving device comprises a series of plates which are transparent to the useful radiation and interchangeable, each plate being arranged alternatively between the lens and the intermediate focusing plane, and producing a different shift of the intermediate image inside said intermediate focusing plane.

10. High-resolution imaging system comprising, along a propagation direction of a useful radiation inside the imaging system:
    a lens which is suitable for forming an intermediate image of a scene inside an intermediate focusing plane;
    an image filter, comprising an opaque, planar mask, provided with openings which are situated in the intermediate focusing plane;
    a planar matrix of microlenses which are identical and juxtaposed in at least two alignment directions, said matrix of microlenses being arranged parallel to and at a distance from the intermediate focusing plane;
    an optical conjugation system, which is arranged in order to form an image of the matrix of microlenses in an image capture plane; and
    an image detection matrix, comprising a set of photosensitive elements arranged in the image capture plane;
    the lens, the image filter mask, the microlenses, the photosensitive elements and the optical conjugation system being effective for the useful radiation,
    each microlens and each photosensitive element being conjugated one by one by the optical conjugation system,
    the openings of the image filter mask being moreover arranged facing the microlenses with a one-to-one relationship between each opening and each microlens, one dimension of each opening of the image filter mask, measured parallel to each alignment direction, being less than or equal to a sampling pitch of the intermediate image, said sampling pitch being itself equal to a repetition pitch of said openings in said alignment direction, but divided by a sub-sampling factor which is a positive integer of 5 or less and greater than unity, the imaging system also comprising:

an image moving device which is suitable for translating the intermediate image within the intermediate focusing plane, using a translation pitch which is equal to or a multiple of the sampling pitch of said intermediate image parallel to each alignment direction;

wherein the optical conjugation system further comprises, along the propagation direction of the useful radiation inside said imaging system, at least:

an optical refocusing system;

an optical relay system arranged for forming an image of the openings of the image filter mask through the microlenses, the optical refocusing system and said optical relay system; and a optical system end portion arranged for forming the image of the matrix of microlenses in the image capture plane through the optical refocusing system, the optical relay system and said optical system end portion; and also comprising a cryostat containing the optical system end portion and the image detection matrix, said cryostat being limited by a wall provided with a window superimposed on the image of the openings of the image filter mask through the microlenses, the optical refocusing system and the optical relay system.

11. High-resolution imaging system comprising, along a propagation direction of a useful radiation inside the imaging system:

a lens which is suitable for forming an intermediate image of a scene inside an intermediate focusing plane;

an image filter, comprising an opaque, planar mask, provided with openings which are situated in the intermediate focusing plane;

a planar matrix of microlenses which are identical and juxtaposed in at least two alignment directions, said matrix of microlenses being arranged parallel to and at a distance from the intermediate focusing plane;

an optical conjugation system, which is arranged in order to form an image of the matrix of microlenses in an image capture plane; and an image detection matrix, comprising a set of photosensitive elements arranged in the image capture plane;

the lens, the image filter mask, the microlenses, the photosensitive elements and the optical conjugation system being effective for the useful radiation, each microlens and each photosensitive element being conjugated one by one by the optical conjugation system, the openings of the image filter mask being moreover arranged facing the microlenses with a one-to-one relationship between each opening and each microlens, one dimension of each opening of the image filter mask, measured parallel to each alignment direction, being less than or equal to a sampling pitch of the intermediate image, said sampling pitch being itself equal to a repetition pitch of said openings in said alignment direction, but divided by a sub-sampling factor which is a positive integer of 5 or less and greater than unity, the imaging system also comprising:

an image moving device which is suitable for translating the intermediate image within the intermediate focusing plane, using a translation pitch which is equal to or a multiple of the sampling pitch of said intermediate image parallel to each alignment direction; and also comprising a control unit suitable for:

controlling the image moving device so as to place the intermediate image successively in positions shifted according to multiples of the sampling pitch, parallel to each alignment direction; and for each position of the intermediate image, issuing a command for an image capture and recording sequence to be performed by the image detection matrix.

12. The high-resolution system according to claim 11, also comprising:

an image reconstruction unit, suitable for combining the images which are captured and recorded respectively for the successive positions of the intermediate image, by means of interlacing according to said successive positions.

* * * * *